United States Patent [19]

Ishikawa et al.

[11] Patent Number: 5,444,416

[45] Date of Patent: Aug. 22, 1995

[54] DIGITAL FM DEMODULATION APPARATUS DEMODULATING SAMPLED DIGITAL FM MODULATED WAVE

[75] Inventors: Yutaka Ishikawa, Nara; Shingo Nomura, Mie, both of Japan

[73] Assignee: Sharp Kabushiki Kaisha, Osaka, Japan

[21] Appl. No.: 177,405

[22] Filed: Jan. 5, 1994

[30] Foreign Application Priority Data

Jan. 13, 1993 [JP] Japan ................... 5-004112

[51] Int. Cl.⁶ ............................................. H03D 1/00
[52] U.S. Cl. .................................. 329/341; 329/343; 455/214
[58] Field of Search ............... 329/341, 343, 315, 336, 329/372, 318; 455/214; 327/14, 102; 360/30

[56] References Cited

U.S. PATENT DOCUMENTS

| | | | |
|---|---|---|---|
| 4,543,532 | 9/1985 | Kasser | 329/110 |
| 4,567,442 | 1/1986 | Haussmann | 329/145 |
| 4,875,017 | 10/1989 | Sakazaki | 329/336 |
| 4,994,754 | 2/1991 | Ohta | 329/318 |

OTHER PUBLICATIONS

"Digital Circuits for Television Signal" by Yoshizumi Eto et al., Sep. 25, 1989 p. 76.
Nikkei Electronics 1992 Dec. 7 (No. 569) Masao Tomita et al pp. 165–170.

*Primary Examiner*—Robert J. Pascal
*Assistant Examiner*—David Vu

[57] ABSTRACT

The digital FM demodulation apparatus includes a sampling unit, a frequency specifying unit, and a demodulated value specifying unit. The sampling unit samples an FM modulated wave at predetermined intervals. The frequency specifying unit specifies a frequency of the FM modulated wave at the time of sampling based on a plurality of sampled values. The demodulated value specifying unit specifies a demodulated value corresponding to the frequency to provide the demodulated value.

29 Claims, 4 Drawing Sheets

DIGITAL FM DEMODULATION APPARATUS DEMODULATING SAMPLED DIGITAL FM MODULATED WAVE

BACKGROUND OF THE INVENTION

1. Field of the Invention

The present invention relates to a digital FM demodulation apparatus demodulating FM modulated waves, and particularly to a digital FM demodulation apparatus performing digital sampling at a high frequency.

2. Description of the Background Art

While an FM modulated wave has been demodulated conventionally by an analog FM demodulation apparatus, an FM demodulation apparatus has been developed with a digital circuit which has been made more functional due to advances in semiconductor technology.

A conventional digital FM demodulation apparatus performs digital FM demodulation in an arc tangent system, description of which will hereinafter be described.

An FM modulated wave y(t) is described by:

$$y(t) = \sin\phi(t) \tag{1}$$

where $\phi(t)$ is a carrier phase. The carrier phase $\phi(t)$ should satisfy the following relation with a demodulated wave Y(t):

$$d\phi(t)/dt = \omega(t) = \omega_c + Y(t) \tag{2}$$

The above equation shows change of an instantaneous frequency $\omega$ of the carrier in the vicinity of $\omega_c$ according to Y(t).

Considering the carrier, as two components A and B orthogonal to each other, the following equation is obtained:

$$\tan\phi(t) = B/A \tag{3}$$

From the equations (2) and (3), the demodulated wave Y(t) is described by the following:

$$Y(t) = d\{\text{atan}(B/A)\}/dt \tag{4}$$

With a hardware structured according to the above equations, a digital FM demodulation apparatus in an arc tangent system can be implemented.

FIG. 7 is a block diagram of a conventional digital FM demodulation apparatus in accordance with the above-described system. As shown in FIG. 7, the digital FM demodulation apparatus includes a sampling circuit 11, a 90° phase splitter 12, an arithmetic circuit 13, and a differentiating circuit 14. 90° phase splitter 12 splits an FM modulated wave y(t) sampled by sampling circuit 11 into a component A with respect to 0° and a component B with respect to 90° to provide the same to arithmetic circuit 13. Arithmetic circuit 13 includes a table ROM (Read Only Memory) in which a value of atan(-B/A) to be defined by the components A and B of the FM modulated wave y(t) has been written. Arithmetic circuit 13 reads out the value of atan (B/A) to be defined by the components A and B, i.e. a carrier phase $\phi(t)$, from the table ROM to provide the same to differentiating circuit 14. Arithmetic circuit 13 does not carry out an operation of atan (B/A), but only reads out a value from the table ROM. Accordingly, the processing requires less time, which will scarcely cause delay. Differentiating circuit 14 differentiates the input carrier phase $\phi(t)$ to provide a demodulated wave Y(t), and FM demodulation is thus completed.

FIG. 8 is a detailed block diagram showing 90° phase splitter 12 in the digital FM demodulation apparatus. Since the circuit shown in FIG. 8 is a phase circuit employing Hilbert transform constituted of delay, multiplication, and addition and subtraction, various delay circuits, multiplier circuits, and adder-subtractor circuits are required, causing large scale and long delay time of the circuit.

SUMMARY OF THE INVENTION

An object of the present invention is to provide a digital FM demodulation apparatus of small circuit scale and short delay time.

The digital FM demodulation apparatus of the present invention includes a sampling unit for sampling an FM modulated wave at predetermined intervals, a frequency specifying unit for specifying a frequency at the time of sampling based on a plurality of the sampled values obtained by the sampling unit, and a demodulated value specifying unit for specifying a demodulated value based on the specified frequency by the frequency specifying unit.

Digital demodulation, therefore, can be carried out with a simple structure in which a simple operation is performed for a plurality of sampled data to provide a demodulated value based on the data. Accordingly, a conventional 90° phase splitter and a conventional differentiating circuit are not required, which enables a smaller circuit scale. In addition, simplicity of each processing enables reduced delay time.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

The digital FM demodulation apparatus in accordance with one embodiment of the present invention will hereinafter be described with the drawings.

Figure 1:
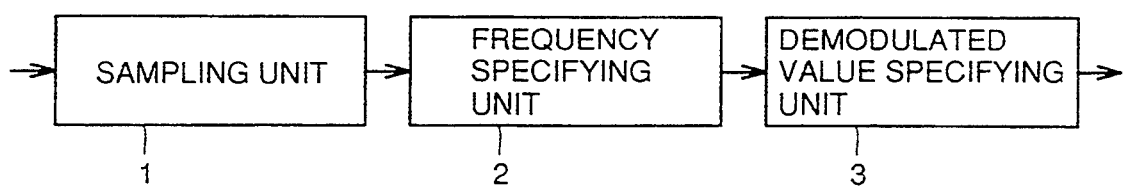
FIG. 1 is a block diagram functionally showing a digital FM demodulation apparatus in accordance with one embodiment of the present invention.

In FIG. 1, the digital FM demodulation apparatus includes a sampling unit 1, a frequency specifying unit 2, and a demodulated value specifying unit 3. Sampling unit 1 is externally supplied with an FM modulated wave y(t), and samples a value of the FM modulated wave y(t) at each sampling to provide the value to frequency specifying unit 2. Frequency specifying unit 2 calculates an instantaneous frequency of the FM modulated wave y(t) at the time of sampling based on the input sampled values. Demodulated value specifying unit 3 calculates a demodulated value at the instantaneous frequency to. Through these operations digital FM demodulation is performed.

Description will now be made on the case where a video luminance signal FM modulated by an analog VTR is to be demodulated. Specifically, an FM modulated video luminance signal is to be sampled at 28.63 MHz as 10-bit digital data, FM demodulated, and converted into 12-bit luminance signal digital data.

Figure 2:
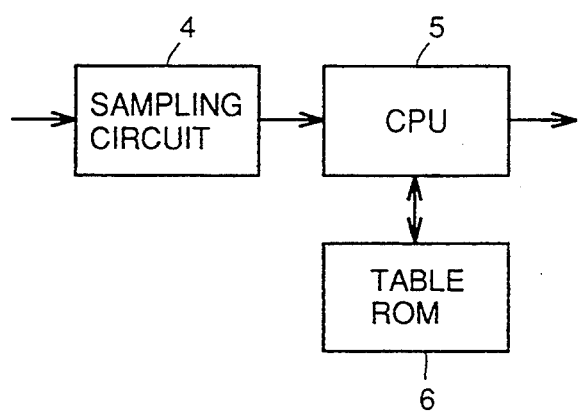
FIG. 2 is a block diagram of the digital FM demodulation apparatus in accordance with one embodiment of the present invention.

In FIG. 2, the digital FM demodulation apparatus includes a sampling circuit 4, a CPU (Center Processing Unit) 5, and a table ROM 6. An FM modulated video luminance signal is sampled at a sampling frequency of 28.63 MHz by sampling circuit 4, and provided to CPU 5 as 10-bit digital data. CPU 5 performs a prescribed program to calculate an instantaneous frequency at sampling based on the sampled digital data.

Figure 3:
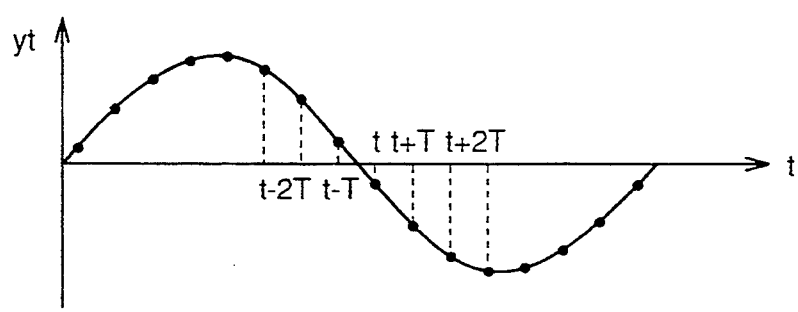
FIG. 3 is a graph showing sampling processing of an FM modulated wave.

Description will now be made on a method of calculating an instantaneous frequency based on sampled values. As shown in FIG. 3, when an FM modulated wave is sampled at a sampling interval T, respective sampled data values $Y_{t-T}$, $Y_t$, and $Y_{t+T}$ at time t-T, t, and t+T are described as follows:

$$y_{t-T} = A\sin\{2\pi f(t-T) + \theta\} \quad (5)$$

$$y_t = A\sin(2\pi ft + \theta) \quad (6)$$

$$y_{t+T} = A\sin\{2\pi f(t+T) + \theta\} \quad (7)$$

where A, f, and $\theta$ are an amplitude, an instantaneous frequency, an initial phase of $y_t$ at the time t, respectively.

From the equations (5) (6), and (6) (7), the following equations are provided, respectively:

$$y_{t-T}/y_t = \sin\{(2\pi ft+\theta) - 2\pi fT\}/\sin(2\pi ft+\theta) \quad (8)$$

$$y_{t+T}/y_t = \sin\{(2\pi ft+\theta) + 2\pi fT\}/\sin(2\pi ft+\theta) \quad (9)$$

Provided that $\alpha = 2\pi ft+\theta$, and $\beta = 2\pi fT$, the equations (8) and (9) are described as follows:

$$y_{t-T}/y_t = \cos\beta - \sin\beta/\tan\alpha \quad (10)$$

$$y_{t+T}/y_t = \cos\beta + \sin\beta/\tan\alpha \quad (11)$$

From the equations (10) and (11), the following equation is provided:

$$\beta = \cos^{-1}\{(y_{t-T}+y_{t+T})/2y_t\} \quad (12)$$

where $\beta = 2\pi fT$. An instantaneous frequency $f_t$ at the time t, therefore, is given by:

$$f_t = [\cos^{-1}\{(y_{t-T}+y_{t+T})/2y_t\}]/2\pi T \quad (13)$$

The instantaneous frequency $f_t$ at the time t can thus be obtained from the sampled value $y_t$ and the preceding and succeeding sampled values $y_{t-T}$ and $y_{t+T}$.

In accordance with the above-described method, CPU 5 performs a prescribed program, stores the sampled values $y_{t-T}$, $y_t$, and $y_{t+T}$, and calculates a value $(y_{t-T}+y_{t+T})/2$. After calculation, CPU 5 provides the calculated value and the sampled value $y_t$ to table ROM 6 to designate an address in table ROM 6.

Table ROM 6 has an address region including the upper ten bits and the lower ten bits, and a data region of 12 bits. The value $(y_{t-T}+y_{t+T})/2$ provided from CPU 5 corresponds to the upper address, while the value $y_t$ corresponds to the lower address. In the data region corresponding to this address, a demodulated value for the instantaneous frequency $f_t$ obtained by substituting $(y_{t-T}+y_{t+T})/2$ and $y_t$ for the equation (13) is stored.

Figure 4:
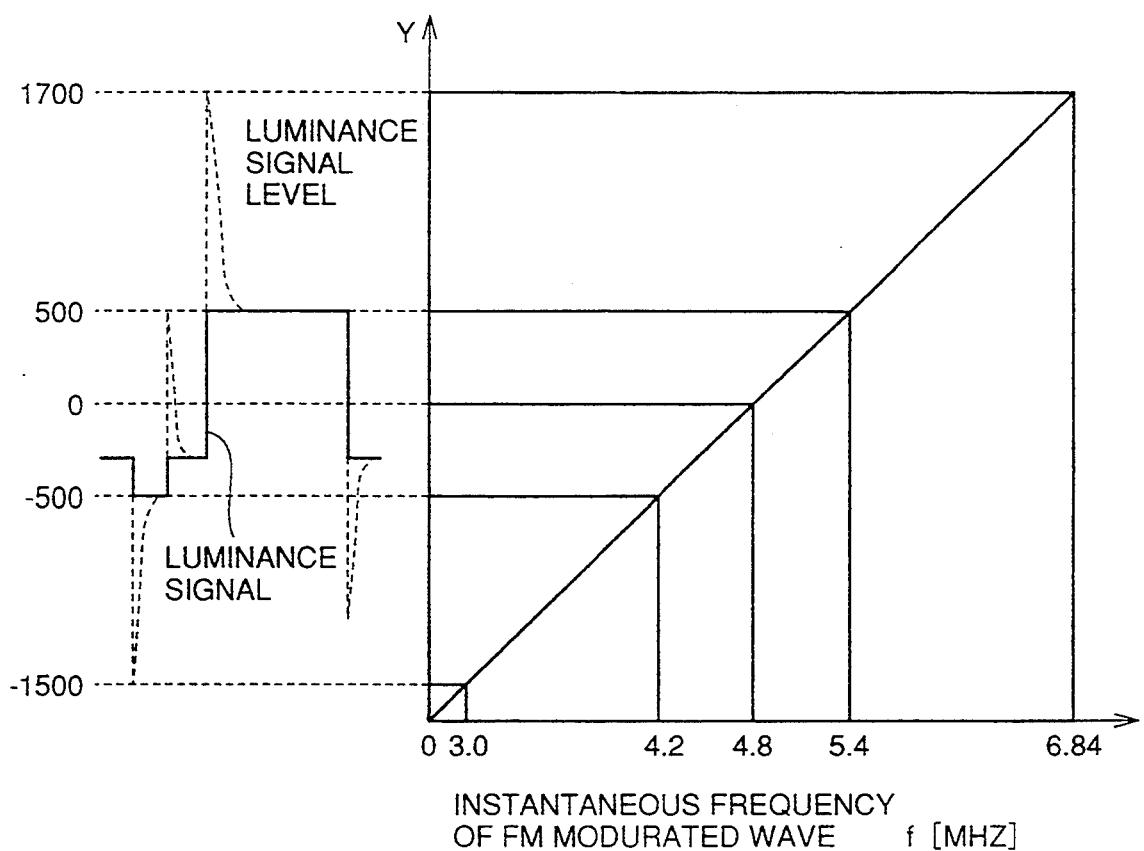
FIG. 4 is a graph showing the relation between an instantaneous frequency of an FM modulated wave and a luminance signal level.

Description will be now given on how a demodulated value is obtained. In FIG. 4, the instantaneous frequency f is converted into 10-bit data, and the luminance signal level $y_t$ is converted into 12-bit data. The FM modulated wave is set to have the center frequency of 4.8 MHz. The frequency difference of 0.6 MHz corresponds to a luminance signal level of 500, and a luminance signal level of $-500$ corresponds to a horizontal synchronization level of the luminance signal. The above relation is described by:

$$Y_t = \text{int}\,[500\{(f_t(\text{MHz}) - 4.8\,(\text{MHz}))/0.6(\text{MHz})\}] \quad (14)$$

Therefore, the luminance signal level $Y_t$ can be obtained by substituting the instantaneous frequency $f_t$ for the equation (14). According to this transform, the luminance signal shown in the left side of FIG. 4 can be provided.

Since luminance signal level data corresponding to data (address) provided from CPU 5 is stored in table ROM 6, the luminance signal level data can be obtained instantaneously with least delay time.

Figure 5:
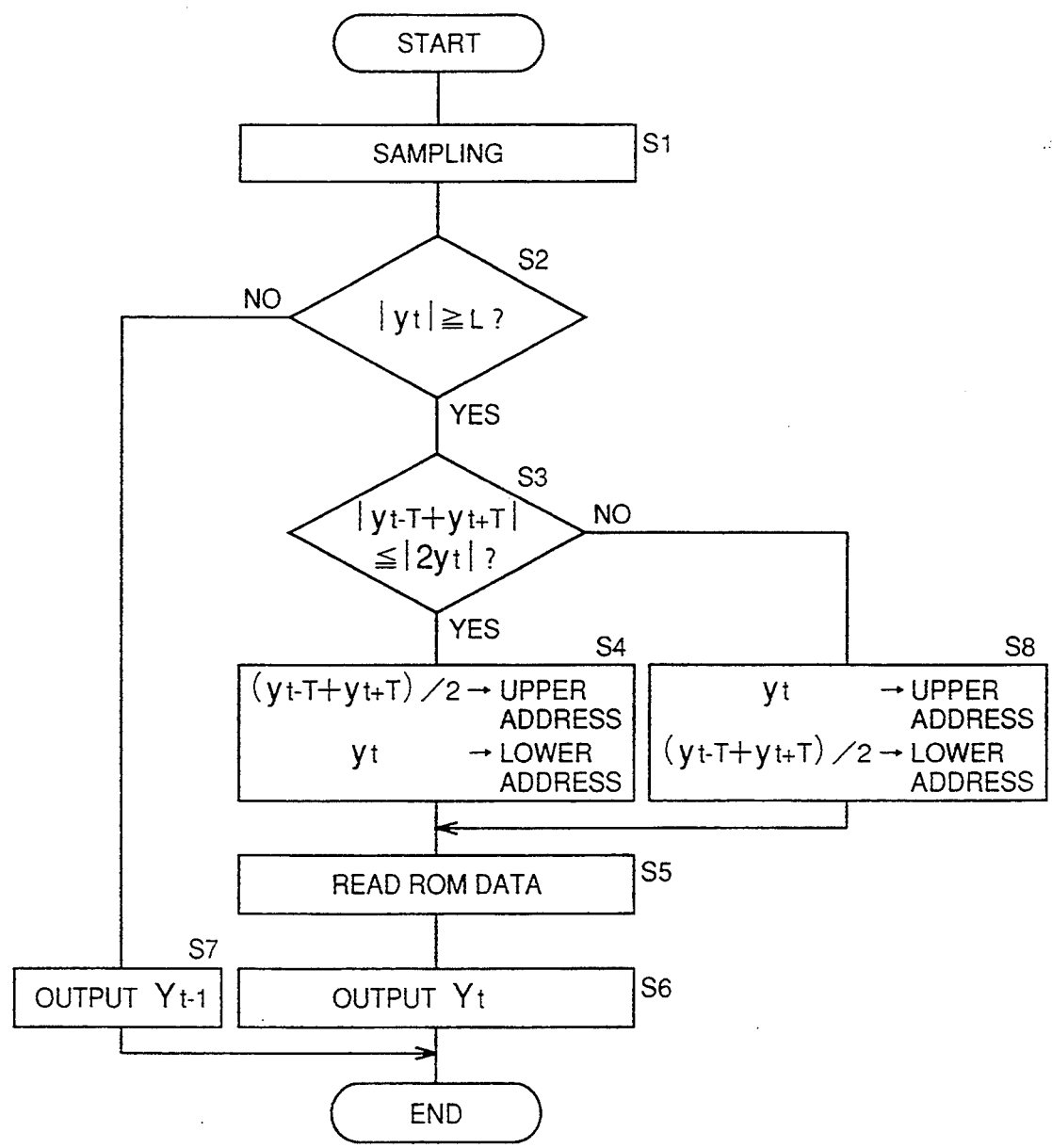
FIG. 5 is a flow chart showing a correction operation.

Description will now be made, with reference to the flow chart of FIG. 5, on a method of correcting data where a sampled value does not satisfy prescribed conditions because of noise on an input FM modulated wave or some other reasons which cause disturbances in the input FM modulated wave.

At step S1, CPU 5 reads a prescribed program, and receives a sampled value $y_t$ of an FM modulated wave by sampling circuit 4.

At step S2, CPU 5 determines whether an absolute value of $y_t$ is larger than a prescribed value L. If $y_t$ is small, operation error in subsequent processing will be large. The value L should be, therefore, set to a value so as to make operation error smaller, and not to affect a response speed. When $|y_t|$ is larger than the value L, the routine proceeds to step S3, and continues usual processing. When $|y_t|$ is smaller than the value L, the routine proceeds to step S7, where CPU 5 provides the luminance signal level $y_{t-1}$ precedingly provided.

Figure 6:
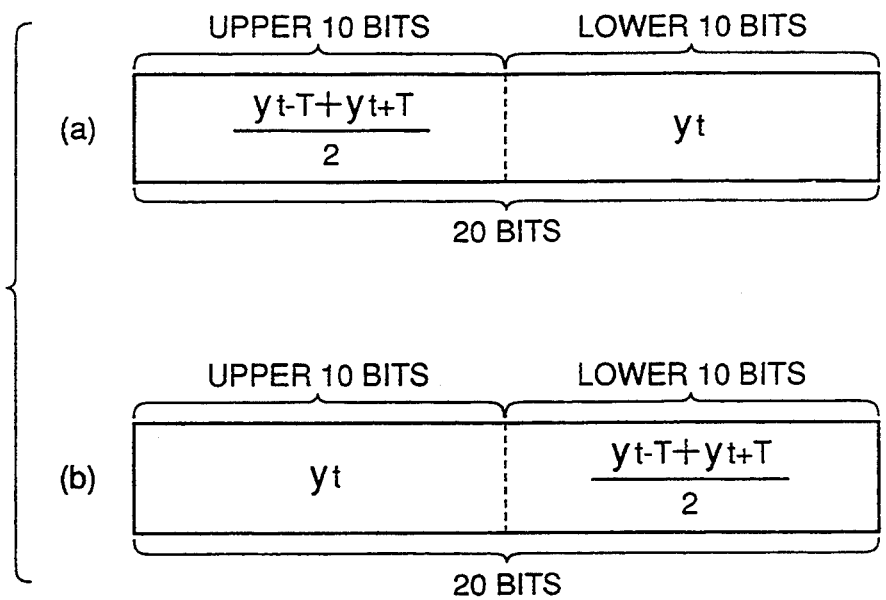
FIG. 6 is a diagram showing an address having data stored.
Figure 7:
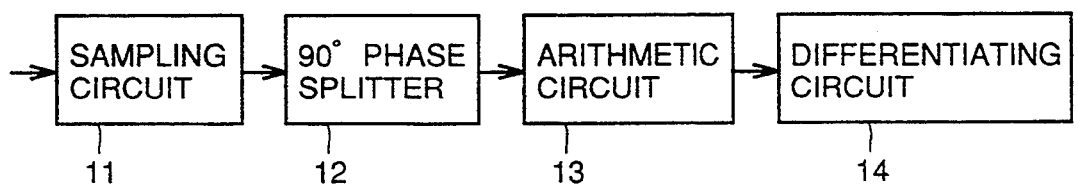
FIG. 7 is a block diagram of a conventional digital FM demodulation apparatus.
Figure 8:
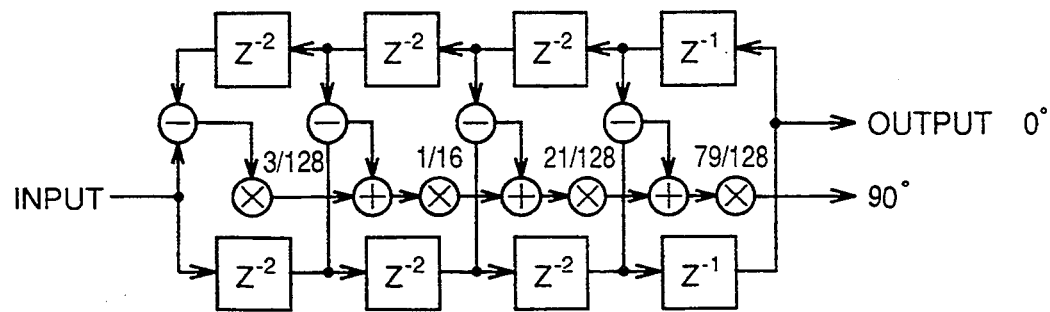
FIG. 8 is a block diagram of the 90° phase splitter.

As is realized from the equation (13), $|(y_{t-T}+y_{t+T})/2y_t|$ should not be more than one, in other words, $|y_{t-T}+y_{t+T}|$ should not be more than $|2y_t|$; otherwise, the sampled value might be detected incorrectly because of noise and factors causing disturbance in the FM modulated wave. In such a case, the incorrect data is corrected according to this conditional expression. Specifically, when $|y_{t-T}+y_{t+T}|$ is larger than $|2y_t|$, the data is determined to be incorrect, and the routine proceeds to step S8. At step S8, $y_t$ is provided to the upper address, and $(y_{t-T}+y_{t+T})/2$ is provided to the lower address, so that respective data values are stored in the address region of table ROM 6, as shown in FIG. 6(b). When $|y_{t-T}m+y_{t+T}|$ is not more than $|2y_t|$, detected data is determined to be correct, and the routine proceeds to step S4. At step S4, $(y_{t-T}+y_{t+T})/2$ is provided to the upper address, and $y_t$ is provided to the lower address, so that respective data values are stored in the address region of table ROM 6, as shown in FIG. 6(a).

After termination of processing in steps S4 and S8, the routine proceeds to step S5. At step S5, CPU 5 reads a demodulated value stored in the designated address in table ROM 6, and provides the same as the luminance signal level $Y_t$.

Through the above process, digital FM demodulation operation with less operation error and without incorrect detection can be realized.

In the above method, determination is made as to whether $|y_{t-T}+y_{t+T}|$ is not more than $|2y_t|$, so that address and dataregions for the case where $|y_{t-T}+y_{t+T}|$ is larger than $|2y_t|$ are not required. Accordingly, since the capacity of table ROM 6 having 20-bit address and 12-bit data can be halved, reduction in the capacity of the ROM can also be implemented.

Although operational processing is performed by CPU 5 in the above embodiment, it may be carried out with a digital circuit in a hardware manner, so that higher operation speed, and thus digital FM demodulation at a higher speed can be implemented.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A digital FM demodulation apparatus demodulating an FM modulated wave, comprising:
    sampling means for sampling said FM modulated wave at prescribed intervals;
    frequency specifying means for specifying a frequency at the time of sampling based on a plurality of sample values obtained by said sampling means;
    demodulated value specifying means for specifying a demodulated value based on the specified frequency by said frequency specifying means; and
    correction means for correcting said demodulated value, when a sample value presently obtained by said sampling means does not satisfy a prescribed condition.

2. The digital FM demodulation apparatus according to claim 1, wherein
    said correction means includes means for providing a demodulated value at a preceding sampling, when said sample value presently obtained by said sampling means is smaller than a prescribed value.

3. The digital FM demodulation apparatus according to claim 1, wherein
    said sampling means samples said FM modulated wave at a prescribed sampling interval T to obtain at least three sample values $y_{t-T}$, $y_t$, $y_{t+T}$ at times t-T, t, and t+T; and
    said correcting means corrects said demodulated value when said sample value $y_t$ does not satisfy a prescribed condition.

4. The digital FM demodulation apparatus according to claim 3, wherein
    said correction means provides a demodulated value specified at said time t−T when said sample value $y_t$ is less than a prescribed value.

5. A digital FM demodulation apparatus demodulating an FM modulated wave, comprising:
    sampling means for sampling said FM modulated wave at prescribed intervals;
    frequency specifying means for specifying a frequency at the time of sampling based on a plurality of sample values obtained by said sampling means;
    demodulated value specifying means for specifying a demodulated value based on the specified frequency by said frequency specifying means; and
    correction means for correcting said sample values, when said sample values obtained by said sampling means do not satisfy a prescribed condition.

6. The digital FM demodulation apparatus according to claim 5, wherein
    said sampling means samples said FM modulated wave at a prescribed sampling interval T to obtain at least three sample values $y_{t-T}$, $y_t$, $y_{t+T}$ at times t−T, t, and t+T; and
    said frequency specifying means specifies said frequency based on an expression $f_t = [\cos^{-1}\{(y_{t-T}+y_{t+T})/2y_t\}]/2\pi T$, and specifies said frequency $f_t$ with $(y_{t-T}+y_{t+T})/2$ as $y_t$ and $y_t$ as $(y_{t-T}+y_{t+T})$ when $|y_{t-T}+y_{t+T}| > |2Y_t|$.

7. The digital FM demodulation apparatus according to claim 5, wherein said frequency specifying means and said demodulated value specifying means include storage means for storing demodulated values to be specified based on said plurality of sampled values.

8. The digital FM demodulation apparatus according to claim 7, wherein
    said sampling means samples said FM modulated wave at a prescribed sampling interval T to obtain at least three sample values $y_{t-T}$, $y_t$, $y_{t+T}$ at times t−T, t, and t+T; and
    said storage means stores demodulated values to be specified based on said sample values such that each demodulated value is specified by a first address and a second address, and said storage means employs $(y_{t-T}+y_{t+T})/2$ as said first address and $y_t$ as said second address when $|y_{t-T}+y_{t+T}| <= |y_t|$.

9. The digital FM demodulation apparatus according to claim 8, wherein
    said correcting means causes said storage means to employ $y_t$ as said first address and $(y_{t-T}+y_{t+T})/2$ as said second address when $|y_{t-T}+y_{t+T}| > |y_t|$.

10. A digital FM demodulation apparatus demodulating an FM modulated wave, comprising:
    sampling means for sampling said FM modulated wave at a prescribed sampling interval T to obtain at least three sample values $y_{t-T}$, $y_t$, $y_{t+T}$ at times t−T, t, and t+T;
    storage means for storing demodulated values to be specified based on said sample values, each demodulated value being specified by a first address and a second address; and
    demodulated value output means for reading a demodulated value from said storage means based on said sample values, said demodulated value output means employing $(y_{t-T}+y_{t+T})/2$ as said first address and $y_t$ as said second address when $|y_{t-T}+y_{t+T}| \leq |y_t|$.

11. The digital FM demodulation apparatus according to claim 10, wherein
    said demodulated value output means employs $y_t$ as said first address and $(y_{t-T}+y_{t+T})/2$ as said second address when $|y_{t-T}+y_{t+T}| > |y_t|$.

12. The digital FM demodulation apparatus according to claim 11, wherein said storage means stores demodulated values corresponding to a frequency $f_t$, said frequency $f_t$ being specified by each set of said sample values according to an expression $f_t=[\cos^{-1}\{(y_{t-T}+y_{t+T})/2y_t\}]/2\pi T$.

13. The digital FM demodulation apparatus according to claim 10, wherein said first and second address have an identical number of bits.

14. A digital FM demodulation apparatus demodulating an FM modulated wave, comprising:

sampling means for sampling said FM modulated wave at a prescribed sampling interval T to obtain at least three sample values $y_{t-T}$, $y_t$, $y_{t+T}$ at times t-T, t, and t+T; and storage means for storing demodulated values to be specified based on said sample values, each demodulated value being specified by a first address and a second address; and demodulated value output means for reading a demodulated value from said storage means based on said sample values, said demodulated value output means employing $(y_{t-T}+y_{t+T})/2$ as said second address and $y_t$ as said first address when $|y_{t-T}+y_{t+T}|>|y_t|$.

15. A digital FM demodulation apparatus demodulating an FM modulated wave, comprising:

sampling means for sampling said FM modulated wave at a prescribed sampling interval T to obtain at least three sample values $y_{t-T}$, $y_t$, $y_{t+T}$ at times t−T, t, and t+T;

frequency specifying means for specifying said frequency based on an expression $f_t=[\cos^{-1}\{(y_{t-T}+y_{t+T})/2y_t\}]/2\pi T$, and specifying said frequency $f_t$ with $(y_{t-T}+y_{t+T})/2$ as $y_t$ and $y_t$ as $(y_{t-T}+y_{t+T})$ when $|y_{t-T}+y_{t+T}|>|2Y_t|$; and demodulated value specifying means for specifying a demodulated value based on the specified frequency by said frequency specifying means.

16. A method of demodulating an FM modulated wave, comprising:

a) sampling said FM modulated wave at a prescribed sampling interval T to obtain at least three sample values $y_{t-T}$, $y_t$, $y_{t+T}$ at times t−T, t, and t+T;

b) storing, in a storage means, demodulated values to be specified based on said sample values, each demodulated value being specified by a first address and a second address; and c) reading demodulated values from said storage means based on said sample value, step c) employing $(y_{t-T}+y_{t+T})/2$ as said first address and $y_t$ as said second address when $|y_{t-T}+y_{t+T}|\leq|y_t|$.

17. The method according to claim 16, wherein step c) employs $y_t$ as said first address and $(y_{t-T}+y_{t+T})/2$ as said second address when $|y_{t-T}+y_{t+T}|>|y_t|$.

18. The method according to claim 17, wherein said step b) stores demodulated values corresponding to a frequency $f_t$, said frequency $f_t$ being specified by each set of said sample values according to an expression $f_t=[\cos^{-1}\{(y_{t-T}+y_{t+T})/2y_t\}]/2\pi T$.

19. The method according to claim 16, wherein said first and second address have an identical number of bits.

20. A method of demodulating an FM modulated wave, comprising:

a) sampling said FM modulated wave at prescribed intervals;

b) specifying a demodulated value based on a plurality of sample values obtained in step a);

c) correcting said demodulated value, when a sample value presently obtained in step a) does not satisfy a prescribed condition.

21. The method according to claim 20, wherein step c) includes the step of providing a demodulated value at a preceding sampling, when said sample value presently obtained by step a) is smaller than a prescribed value.

22. The method according to claim 20, wherein step a) samples said FM modulated wave at a prescribed sampling interval T to obtain at least three sample values $y_{t-T}$, $y_t$, $y_{t+T}$ at times t−T, t, and t+T; and step c) corrects said demodulated value when said sample value $y_t$ does not satisfy a prescribed condition.

23. The method according to claim 22, wherein step c) includes the step of providing a demodulated value specified at said time t−T when said sample value $y_t$ is less than a prescribed value.

24. A method of demodulating an FM modulated wave, comprising:

a) sampling said FM modulated wave at prescribed intervals;

b) specifying a demodulated value based on a plurality of sample values obtained in step a); and c) correcting said sample values, when said sample values obtained in step a) do not satisfy a prescribed condition.

25. The method according to claim 24, wherein step b) includes b1) specifying a frequency at a time of sampling based on said sample values; and b2) specifying a demodulated value based on said specified frequency.

26. The method according to claim 25, wherein step a) samples said FM modulated wave at a prescribed sampling interval T to obtain at least three sample values $y_{t-T}$, $y_t$, $y_{t+T}$ at times t−T, t, and t+T; and step b1) specifies said frequency based on an expression $f_t=[\cos^{-1}\{(y_{t-T}+y_{t+T})/2y_t\}]/2\pi T$, and specifies said frequency $f_t$ with $(y_{t-T}+y_{t+T})/2$ as $y_t$ and $y_t$ as $(y_{t-T}+y_{t+T})$ when $|y_{t-T}+y_{t+T}|>|2Y_t|$.

27. The digital FM demodulation apparatus according to claim 24, wherein step a) samples said FM modulated wave at a prescribed sampling interval T to obtain at least three sample values $y_{t-T}$, $y_t$, $y_{t+T}$ at times t−T, t, and t+T; and step b) specifies said demodulated value by reading said demodulated value from a storage means, said storage means storing demodulated values such that each demodulated value is specified by a first address and a second address, and step b) employs $(y_{t-T}+y_{t+T})/2$ as said first address and $y_t$ as said second address when $|y_{t-T}+y_{t+T}|<=|y_t|$.

28. The digital FM demodulation apparatus according to claim 27, wherein step c) causes step b) to employ $y_t$ as said first address and $(y_{t-T}+y_{t+T})/2$ as said second address when $|y_{t-T}+y_{t+T}|>|Y_t|$.

29. A method of demodulating an FM modulated wave, comprising:

a) sampling said FM modulated wave at a prescribed sampling interval T to obtain at least three sample values $Y_{t-T}$, $Y_t$, $y_{t+T}$ at times t−T, t, and t+T;

b) specifying a frequency at the time of sampling based on an expression $f_t = [\cos^{-1}\{(y_{t-T}+y_{t+T})/2y_t\}]/2\pi T$, and specifying said frequency $f_t$ with $(y_{t-T}+y_{t+T})/2$ as $y_t$ and $y_t$ as $(y_{t-T}+y_{t+T})$ when $|y_{t-T}+y_{t+T}| > 2Y_t|$; and c) specifying a demodulated value based on said specified frequency.

* * * * *